US006561820B2

(12) United States Patent
Stone et al.

(10) Patent No.: US 6,561,820 B2
(45) Date of Patent: May 13, 2003

(54) SOCKET PLANE

(75) Inventors: Brent S. Stone, Chandler, AZ (US); Lesley A. Polka, Chandler, AZ (US); Raj Nair, Gilbert, AZ (US); Sanjay Dabral, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/963,439

(22) Filed: Sep. 27, 2001

(65) Prior Publication Data

US 2003/0060063 A1 Mar. 27, 2003

(51) Int. Cl.7 ........................... H01R 12/00; H05K 1/00
(52) U.S. Cl. ......................................... 439/70; 439/181
(58) Field of Search .................................... 439/70, 181

(56) References Cited

U.S. PATENT DOCUMENTS 3,685,002 A * 8/1972 Kennedy ..................... 439/70
4,943,891 A * 7/1990 Ouellette ..................... 439/70
5,481,436 A * 1/1996 Werther ....................... 439/70
5,536,181 A * 7/1996 Karnavas ..................... 439/70

* cited by examiner

*Primary Examiner*—Javaid Nasri
(74) *Attorney, Agent, or Firm*—Antonelli, Terry, Stout & Kraus, LLP

(57) ABSTRACT

A method and apparatus for a conductive plate for a socket. The conductive plate includes a plurality of openings. The conductive plate is electrically connected to ground and is contained within a socket that may receive an electronic package. The openings allow pins from the electronic package to pass through to contacts in the socket. The diameter of each opening is customizable to produce desired impedance between the electronic package pin inserted in the contact and the conductive plate. Impedance discontinuity seen by signals passing through the socket from the electronic package pins is reduced. The electronic plate may contain one or more pins insertable into contacts in the socket where the contacts provide the electrical connection to ground.

21 Claims, 4 Drawing Sheets

SOCKET PLANE

BACKGROUND

1. Field of the Invention

This invention relates to sockets for electronic device packages, and more specifically to sockets that reduce impedance discontinuity.

2. Background Information

Electronic devices are operating at faster and faster speeds. With this increase in performance, a designer must take into consideration the possibility of increased noise, cross-talk, ringing, etc. that may occur on the signal lines of the electronic device. Electronic devices may reside in any of a number of package technologies, for example, flat pack, dual in-line package (DIP), pinned grid array (PGA), etc. Electronic devices such as microprocessors generally reside on packages with multiple pins such as a PGA. Current PGA socket technology has inherent I/O performance limitations. Manufacturing capability limitations of PGA socket technology limit minimum socket height, socket self inductance, socket loop inductance, and socket pin to pin capacitance. These aspects of the socket design impose impedance discontinuities that limit the performance (i.e., speed) of I/O signaling in electronic device products that use present PGA socket technology.

Currently, these problems have been solved by reducing socket height, controlling pin pitch, optimizing mold material, and optimizing the pin configuration. However, these solutions have limitations. For example, regarding socket height, the height of the socket can only go so small to control inductance. Similarly, pin pitch can only control inductance to a certain degree. Moreover, to reduce impedance discontinuities with pin configuration, one may have to completely surround a signal pin with ground pins. This requires too many pins to practically use a socket for a microprocessor application.

Impedance is equal to the square root of inductance divided by capacitance (I=(SQRT L)/C). Current solutions attempt to control the impedance by controlling the inductance (L). In current solutions however, the inductance is generally too high, or the inductance to capacitance ratio is not controlled to the degree desired. Therefore, when an electronic device in a PGA package, for example, is plugged into a socket, signals on the pins of the PGA package see impedance discontinuities causing signal integrity problems such as noise, ringing, etc. mentioned previously.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

Figure 1:
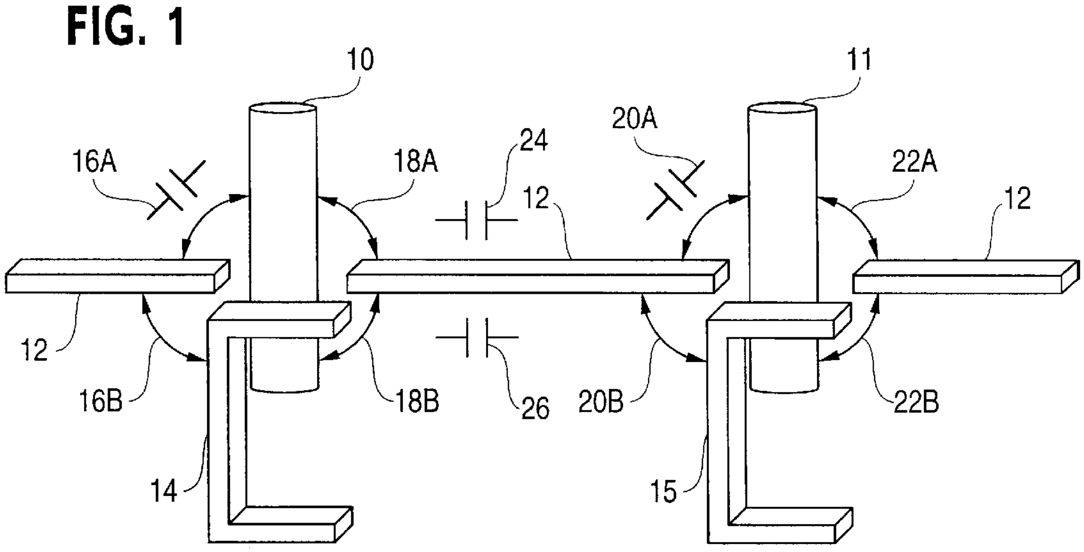
FIG. 1 is a diagram of an internal cross-section of a PGA package pins/socket contacts according to an example embodiment of the present invention.

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to a grounded metal plane embedded within an electronic socket (e.g., PGA socket) normal to the pins connecting to the socket. The placement and clearance of the grounded metal plane in relation to the assembled interconnect of the pins and the socket contacts is such that the plane provides a balancing capacitance that compensates for the inductance of the pins and reduces the discontinuity presented by the socket interconnect elements to controlled impedance signal paths. The dimensions of a hole in the metal plane for a particular pin/socket may be varied to customize the impedance that is desired for a particular I/O pin that passes through the metal plane. The grounded metal plane is embedded within a socket that includes contacts into which pins from an electronic device package plug. The pins pass through the metal plane before entering the socket contacts. The electronic device package may be any type of package including but not limited to pin grid array (PGA), ball grid array (BGA), leadless chip carrier (LCC), etc., and be within the spirit and scope of the present invention. For purposes of illustration, a pin grid array (PGA) package and associated pins will be used to illustrate the present invention.

FIG. 1 shows a diagram of an internal cross-section of a PGA package pins/socket contacts according to an example embodiment of the present invention. Metal conductive plane 12 is grounded (not shown) and resides in a socket along with socket contacts 14, 15. Pins 10, 11 are part of a PGA package and are inserted into socket contacts 14, 15 through conductive plate 12. Grounded conductive plate 12 has openings to allow pins 10 to pass through to socket contacts 14. The lines with arrows at each end represent capacitance between either a pin and the grounded conductive plane 12 or a contact and the grounded conductive plane 12, above and below conductive plane 12. Each double sided arrow represents a capacitor which is shown in some places (e.g., 16*a*, 18*a*, etc.) and not shown in others (e.g., 16*b*, 18*b*, etc.).

Capacitance 16*a* and 16*b* together represent the combination of the pin to plane and contact to plane capacitance for pin 10 and contact 14 on one side of pin 10. Similarly, capacitance 18*a* and 18*b* together represent the pin to plane and contact to plane capacitance associated on the other side of pin 10 and contact 14. Capacitor 24 represents the capacitance between pins 10 and 11 above grounded conductive plane 12. Similarly, capacitor 26 represents the capacitance between pins 10 and 11 below grounded conductive plane 12. Capacitance 20*a* represents the pin to plane capacitance from grounded conductive plate 12 to pin 11 above conductive plate 12 on the left side, and capacitor 20*b* the capacitance between grounded conductive plate 12 and contact 15 below grounded conductive plate 12. Capacitances 22*a* and 22*b* represent the same for the right side of pin 11 and contact 15. The addition of metal plane 12 provides capacitive coupling to each pin 10, 12 and contact 14, 15, respectively, which reduces the impedance discontinuity at the socket. Moreover, coupling between adjacent pin pairs is improved enabling use of the socket for differential signaling.

Figure 2:
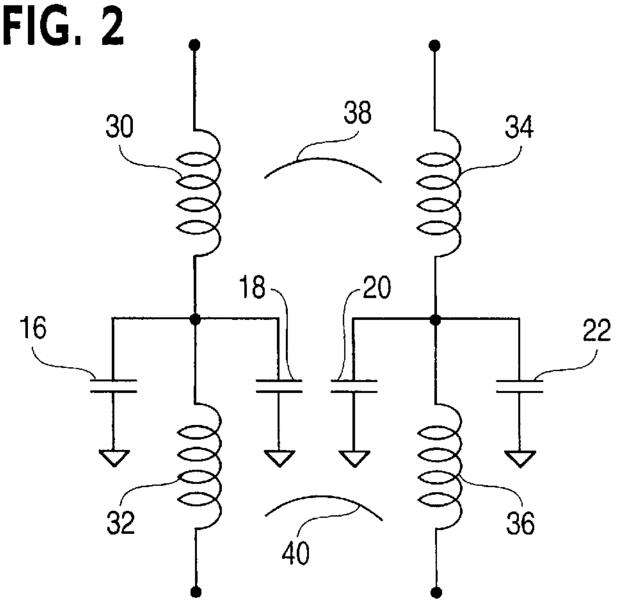
FIG. 2 is a schematic diagram of an equivalent electrical circuit for FIG. 1 depicting the capacitance to ground according to an example embodiment of the present invention.

FIG. 2 shows a schematic diagram of an equivalent electrical circuit for FIG. 1 depicting the capacitance to ground according to an example embodiment of the present invention. Inductor 30 represents the combined inductance above grounded conductive plate 12 for the pin 10/contact 14 combination. Inductor 32 represents the combined inductance below conductive plane 12 for the pin 10/contact 14 combination. Similarly, inductors 34 and 36 represent the combined inductance for the pin 11/contact 15 combination above conductive plate 12 and below conductive plate 12, respectively. Capacitor 16 represents the combination of capacitance 16*a* and 16*b* in FIG. 1, and capacitor 18 represents the combination of capacitance 18*a* and 18*b* in FIG. 1. Similarly, capacitor 20 represents the combined capacitance 20*a* and 20*b* in FIG. 1 and capacitor 22 represents the combined capacitance 22*a* and 22*b*. The arc shape 38 and 40 represent the combination of the mutual inductance between the pins (Lm) and the mutual capacitance between the pins (Cm) for above plane 12 and below plane 12, respectively.

Figure 3:
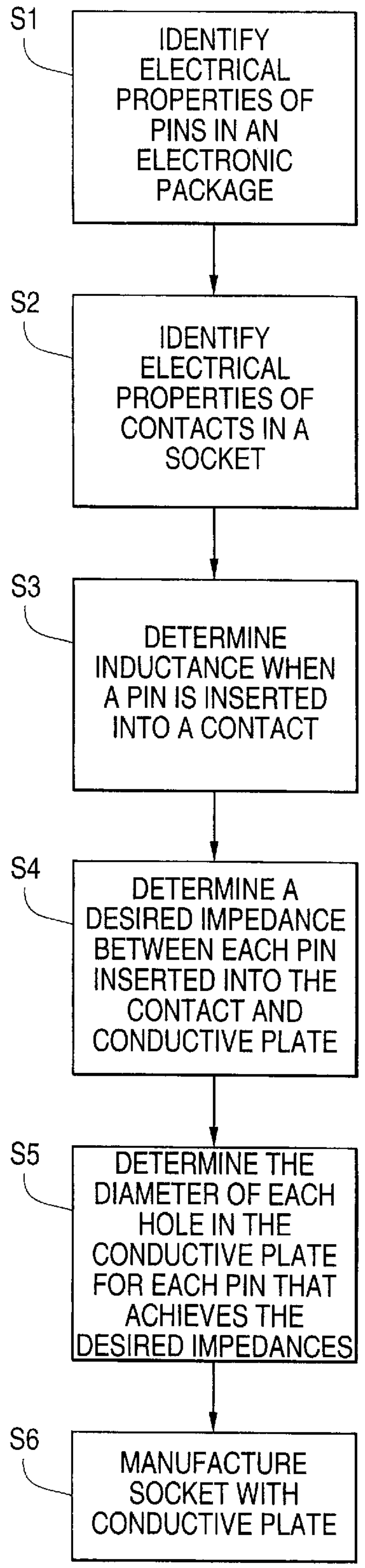
FIG. 3 is a flowchart of a process for a conductive plate according to an example embodiment of the present invention.

FIG. 3 shows a flowchart of a process for a conductive plate according to an example embodiment of the present invention. Initially, the electronic package and associated pins (e.g., PGA package) is identified along with the electrical properties of the pins S1. The electrical properties of the contacts in the socket are determined S2. Generally, these characteristics of the pins of a particular package and the socket contacts in a socket are known. An inductance is determined for the pin/contact pair when the pin is inserted into the contact S3. A desired impedance between each pin/contact pair and the conductive plate is determined S4. Impedance is equal to the square root of inductance divided by capacitance. The inductance is fixed depending on the particular pin and socket. Therefore, by identifying a desired impedance, it is known how to vary the capacitance to get the desired impedance. The diameter of each hole in the conductive plate for each pin/contact pair is determined to achieve the desired impedance S5. The diameter of the hole can be varied to vary the capacitance between the conductive plate and the pin/contact pair. Therefore, knowing a desired impedance, the hole diameter may be set to achieve a particular capacitance that produces the desired impedance. For a particular electronic package pin/contact, the desired impedance may be the same for every pin on the electronic package. In this case, the diameter of each hole in the grounded conductive plate will be the same. However, it is possible that different impedances are desired for different particular pins on a package based on the size of the pin or the signal evolving from the pin. In this case, the grounded conductive plate may have holes of varying diameters dependent on the package pin that is inserted into the hole in the conductive plate. A particular electronic package may contain pins of varying dimensions, therefore, requiring individual impedance determinations and hence different diameter holes in the conductive plate. Once it is determined the diameter of the holes in the conductive plate, the conductive plate can be produced with the required hole diameters, and a socket manufactured that includes the conductive plate S6.

Figure 4:
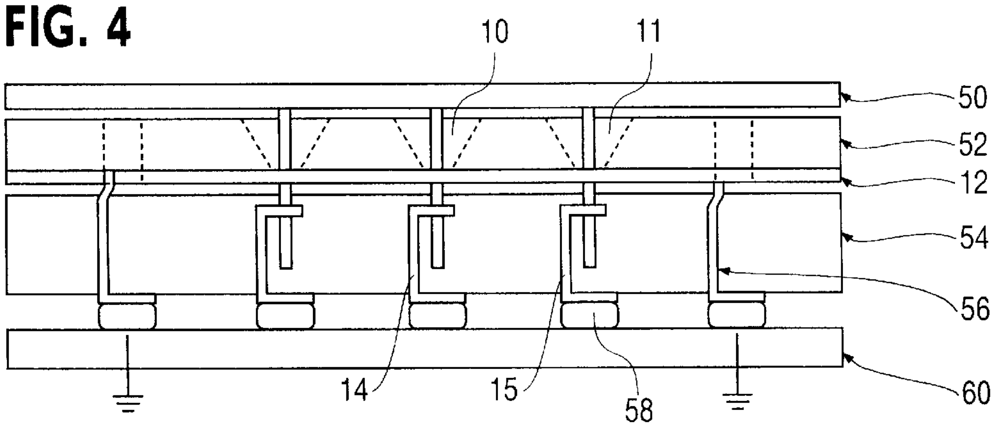
FIG. 4 is a cross sectional diagram of a socket with a conductive plane according to an example first embodiment of the present invention.

FIG. 4 shows a cross sectional diagram of a socket with a conductive plane according to an example first embodiment of the present invention. The socket includes top cover 52, conductive plane 12, base 54, contacts 14, 15, etc. for receiving pins, and ground contacts 56. An electronic device package 50 that includes pins 10, 11, etc., may be plugged into the socket whereby the pins proceed through top cover 52, through holes in grounded conductive plane 12, and into contacts 14, 15, etc. Pins from electronic device package 50 do not make contact with grounded conductive plane 12. Further, the pins may be inserted in contacts in the socket but have no electrical contact until the socket is actuated. This is the case with particular sockets known as zero insertion force (ZIF) sockets where a lever or other device may need to be moved to actually install the package pins electrically into the contacts of the socket.

In the embodiment of the present invention shown in FIG. 4, conductive plane 12 may be embedded in top cover 52. Once the socket is actuated, conductive plate 12 makes contact with ground contacts 56 and is therefore grounded. Top cover 52 may have beveled openings to receive pins from device package 50, and may be moveable upon insertion of device package 50 to help guide the pins into the contacts of the socket. For example, top cover 52 may be laterally moveable as package 50 and associated pins are inserted into the socket. The socket may be electrically attached to a motherboard 60 via the socket contacts and solder balls 58 for each contact. As shown in FIG. 4, ground contacts 56 may be connected to ground via motherboard 60.

Figure 5:
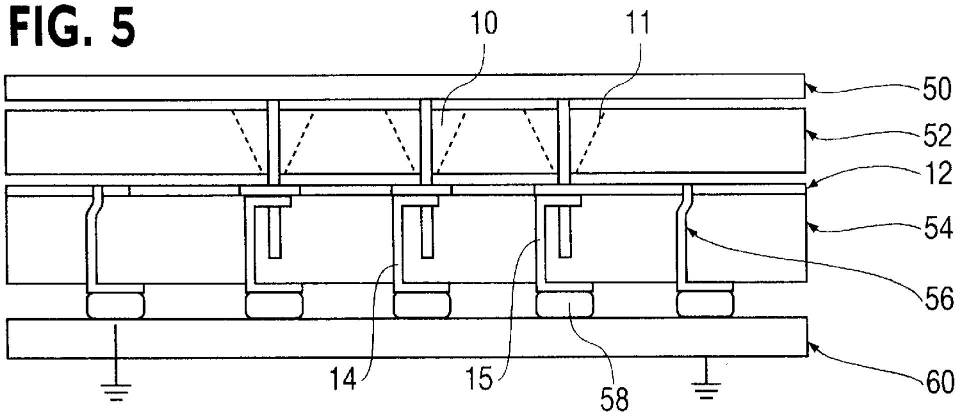
FIG. 5 is a cross sectional diagram of a socket with conductive plane according to an example second embodiment of the present invention.

FIG. 5 shows a cross sectional diagram of a socket with conductive plane according to an example second embodiment of the present invention. In this embodiment, grounded conductive plane 12 is embedded within socket base 54. In this embodiment, contacts 56 inserted in base 54 may be inserted to maintain a permanent connection to conductive plate 12. Conductive plate 12 may be grounded through contacts 56 via motherboard 60.

Figure 6:
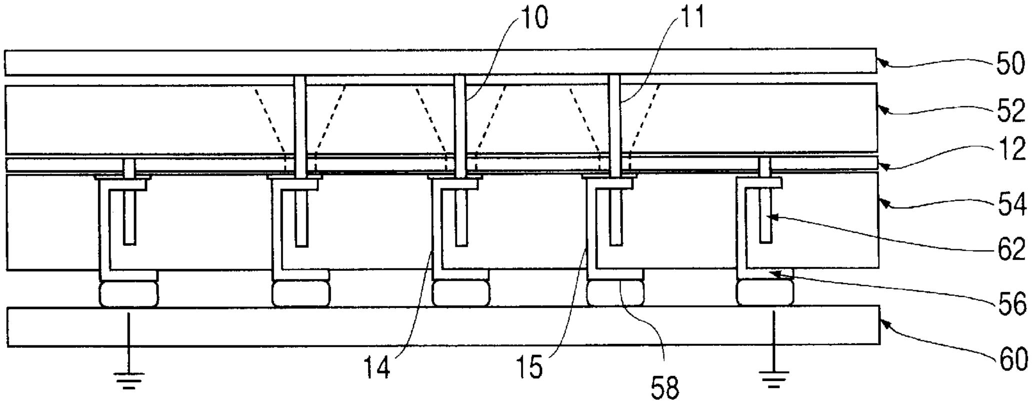
FIG. 6 is a cross sectional diagram of a socket with conductive plane according to an example third embodiment of the present invention.

FIG. 6 shows a cross sectional diagram of a socket with conductive plane according to an example third embodiment of the present invention. In this example embodiment, conductive plane 12 may be a separate item that includes pins 62 that may be inserted into ground contacts 56 in base 54 of the socket. In this embodiment, conductive plane 12 is neither embedded in top cover 52 nor base 54, but makes contact with base 54 through socket contacts 56 and pins 62 that are part of conductive plane 12. Conductive plane 12 may be grounded through contacts 56 via motherboard 60.

Figure 7:
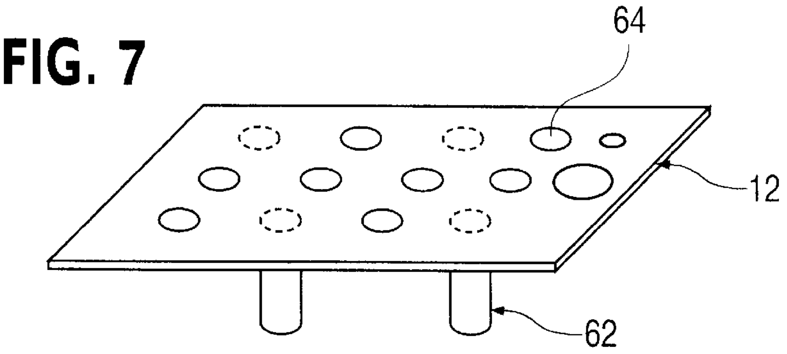
FIG. 7 is a diagram of an example conductive plate according to the example embodiment of the present invention shown in FIG. 6.

FIG. 7 shows a diagram of an example conductive plate according to the example embodiment of the present invention shown in FIG. 6. Conductive plane 12 includes pins 62 that are insertable in contacts in the socket that may be grounded (e.g., via a motherboard). Holes 64 within conductive plane 12 allow pins from an electronic device package to pass through to make contact with contacts in a socket. The diameter of holes 64 is determined based on a desired impedance. By varying the diameter of the holes in conductive plate 12, a desire capacitance is achieved which produces the desired inductance. Therefore, impedance discontinuity as seen by a signal passing through a socket from a pin in an electronic package may be reduced.

The determination of which embodiment between those shown in FIGS. 4–6 is used may be dependent on manufacturing capabilities and processes. For example, one of these embodiments may be found to be either easier to manufacture, or provide other associated manufacturing benefits. Therefore, according to the present invention, a conductive plane may be imbedded in a top cover of a socket, a base of a socket, or include pins that are insertable into contacts in a base of a socket, and still reduce impedance discontinuity as seen by a signal passing through the socket.

Figure 8:
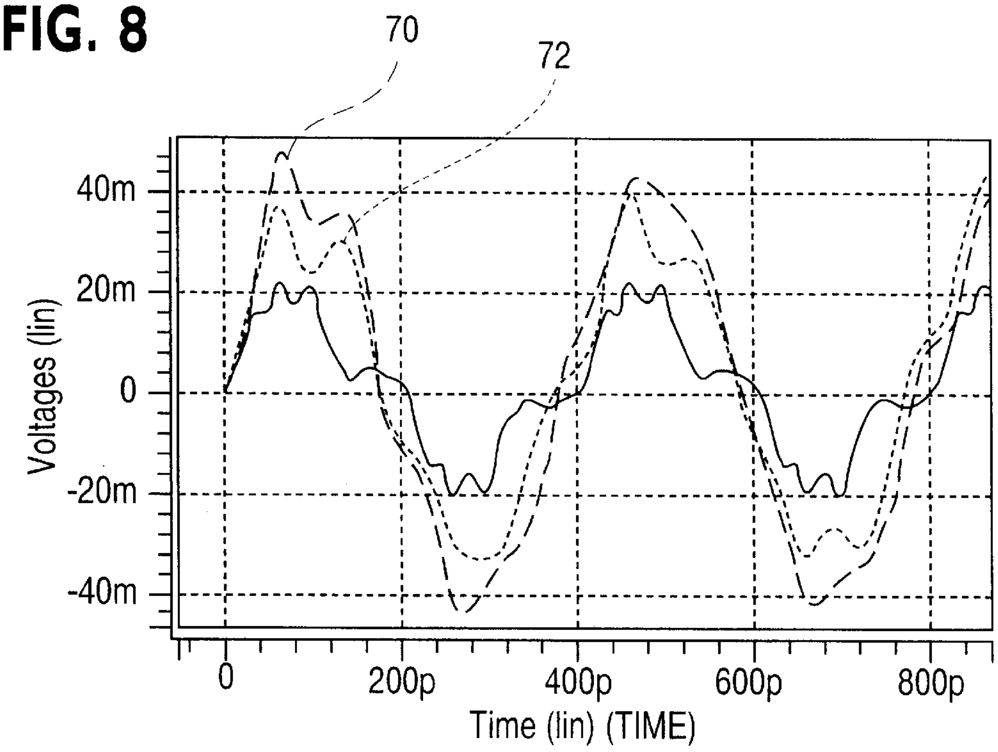
FIG. 8 is an example graph of improved cross talk in a socket according to an example embodiment of the present invention.

FIG. 8 shows an example graph of improved cross talk in a socket according to an example embodiment of the present invention. As shown in the graph, a top graph 70 where the peaks are the highest and the valleys the lowest represent cross talk in traditional PGA sockets. The second graph 72 represents cross talk in a socket according to the present invention. As can be seen in FIG. 8, second graph 72 shows much lower, improved cross talk results as compared with top graph 70 representing traditional PGA sockets.

Sockets with conductive plate according to the present invention are advantageous in that impedance discontinuity of PGA pin/socket contacts is minimized. Moreover, the present invention allows extension of present PGA sockets to differential signaling applications. Further, electrical parasitics (inductance and capacitance) is distributed to avoid potential resonance issues at high frequencies. In addition, the present invention extends the performance of PGA technology above its current limits.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A socket comprising:

a top cover;

at least one contact, each at least one contact containing an opening for receiving a pin from an electronic package insertable into the socket;

a base, the base supporting the at least one contact; and a conductive plate, the conductive plate residing between the top cover and the base and electrically connected to ground, the conductive plate containing an opening for each pin to pass through from the cover to one at least one contact in the base, a diameter of each opening in the conductive plate being customizable to produce a desired inductance between the pin inserted in the contact and the conductive plate, wherein impedance discontinuity seen by a signal passing through the socket from the pin is minimized.

2. The socket according to claim 1, wherein the electronic package is a Pin Grid Array (PGA) package.

3. The socket according to claim 1, wherein the top cover is movable during insertion of the electronic package.

4. The socket according to claim 1, wherein the openings in the conductive plate have at least two different diameters.

5. The socket according to claim 1, wherein the openings in the conductive plate are of the same diameter.

6. The socket according to claim 1, wherein the conductive plate is imbedded within the top cover.

7. The socket according to claim 1, wherein the conductive plate is imbedded within the base.

8. The socket according to claim 1, wherein the conductive plate is connected to ground through at least one contact within the base that does not contain openings for receiving a pin from an electronic package.

9. The socket according to claim 1, the conductive plate further comprising pins, the pins insertable into some of the at least one contact to provide the electrical connection to ground.

10. A conductive plate for a socket comprising:

a plurality of openings, the openings allowing pins from an electronic package to pass through to contacts in the socket, the diameter of each opening being customizable to produce a desired inductance between the electronic package pin inserted in the contact and the conductive plate, and at least one pin, the at least one pin insertable into contacts in the socket electrically connected to ground, wherein impedance discontinuity seen by signals passing through the socket from the electronic package pins is minimized.

11. The conductive plate according to claim 10, wherein the electronic package is a Pin Grid Array (PGA) package.

12. The conductive plate according to claim 10, wherein the openings in the conductive plate have at least two different diameters.

13. The conductive plate according to claim 10, wherein the openings in the conductive plate are of the same diameter.

14. The conductive plate according to claim 10, wherein the conductive plate may be imbedded within a top cover of the socket.

15. The conductive plate according to claim 10, wherein the conductive plate may be imbedded within a base of the socket.

16. A method for reducing impedance discontinuity in a socket comprising:

identifying a pin used in an electronic package;

identifying a contact used in a socket;

determining an inductance when the pin is inserted into the contact;

determining a desired impedance between the pin inserted into the contact and a conductive plate electrically connected to ground, the pin passing through a hole in the conductive plate to be inserted into the contact; and determining a diameter of the hole in the conductive plate that achieves the desired impedance, wherein impedance discontinuity seen by a signal passing through the socket from the pin is minimized.

17. The method according to claim 16, further comprising identifying said pin used in a Pin Grid Array (PGA) package.

18. The method according to claim 16, further comprising the pin passing through holes in the conductive plate to be inserted into the contact, the holes having at least two different diameters for pins from the electronic package.

19. The method according to claim 16, further comprising the pin passing through holes in the conductive plate to be inserted into the contact, the holes being of the same diameter.

20. The method according to claim 16, further comprising imbedding the conductive plate within a top cover of the socket.

21. The method according to claim 16, further comprising embedding the conductive plate within a base of the socket.

* * * * *